(12) United States Patent
Looi

(10) Patent No.: US 10,534,409 B2
(45) Date of Patent: *Jan. 14, 2020

(54) HOT SWAPPING TECHNIQUE FOR EXPANSION CARDS

(71) Applicant: Super Micro Computer, Inc., San Jose, CA (US)

(72) Inventor: Dwight Looi, Belmont, CA (US)

(73) Assignee: SUPER MICRO COMPUTER, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/140,507

(22) Filed: Sep. 24, 2018

(65) Prior Publication Data

US 2019/0056769 A1  Feb. 21, 2019

Related U.S. Application Data

(63) Continuation of application No. 15/674,461, filed on Aug. 10, 2017, now Pat. No. 10,082,842.

(51) Int. Cl.
*G06F 1/18* (2006.01)
*H05K 1/02* (2006.01)

(52) U.S. Cl.
CPC .......... *G06F 1/185* (2013.01); *H05K 1/0215* (2013.01); *H05K 2201/10409* (2013.01)

(58) Field of Classification Search
CPC ........ H05K 1/0215; H05K 2201/10409; G06F 1/185
See application file for complete search history.

(56) References Cited

U.S. PATENT DOCUMENTS

| | | | |
|---|---|---|---|
| 3,895,267 A | 7/1975 | Gordon et al. | |
| 4,149,158 A | 4/1979 | Iwaoka et al. | |
| 4,704,599 A | 11/1987 | Kimmel et al. | |
| 5,258,887 A * | 11/1993 | Fortune ............... | H01L 23/3736 174/252 |
| 5,272,584 A | 12/1993 | Austruy et al. | |
| 5,414,223 A | 5/1995 | Suski et al. | |
| 5,473,499 A | 12/1995 | Weir | |
| 5,519,264 A | 5/1996 | Heyden et al. | |
| 5,790,670 A | 8/1998 | Bramlett | |
| 5,864,653 A | 1/1999 | Tavallaei et al. | |
| 5,910,690 A | 6/1999 | Dorsey et al. | |

(Continued)

FOREIGN PATENT DOCUMENTS

| | | |
|---|---|---|
| CN | 101196762 A | 6/2008 |
| TW | 523662 B | 3/2003 |

*Primary Examiner* — Adrian S Wilson
(74) *Attorney, Agent, or Firm* — Artegis Law Group, LLP

(57) ABSTRACT

One embodiment of the present disclosure set forth a system for hot swapping an expansion card. The system includes a fastener mechanism for coupling an expansion card to a motherboard. The system further includes a switch for controlling voltage supply to the expansion card. When the fastener mechanism is in an activated state, the fastener mechanism secures the expansion card to the motherboard and the switch causes voltage to be supplied to the expansion card. When the fastener mechanism is in a partially activated state, the fastener mechanism secures the expansion card to the motherboard and the switch prevents voltage from being supplied to the expansion card.

20 Claims, 7 Drawing Sheets

(56) References Cited

U.S. PATENT DOCUMENTS

| | | | |
|---|---|---|---|
| 5,959,841 A * | 9/1999 | Allen | G06F 1/181 |
| | | | 312/223.2 |
| 5,991,164 A | 11/1999 | Saito et al. | |
| 6,247,079 B1 | 6/2001 | Papa et al. | |
| 6,606,252 B1 | 8/2003 | Snider | |
| 6,611,429 B2 | 8/2003 | Kline et al. | |
| 6,816,937 B2 | 11/2004 | Meert et al. | |
| 7,049,970 B2 | 5/2006 | Allen et al. | |
| 7,965,517 B2 | 6/2011 | Mayumi et al. | |
| 8,278,948 B2 | 10/2012 | Johnson | |
| 8,358,491 B2 | 1/2013 | Chen et al. | |
| 8,553,425 B2 | 10/2013 | Li et al. | |
| 9,426,904 B2 | 8/2016 | Fitzsimmons et al. | |
| 9,791,900 B1 | 10/2017 | Beall et al. | |
| 9,817,448 B2 | 11/2017 | Yang | |
| 10,082,842 B1 * | 9/2018 | Looi | G06F 1/185 |
| 2005/0037658 A1* | 2/2005 | Mayer | G06F 1/184 |
| | | | 439/374 |
| 2016/0174377 A1* | 6/2016 | Chuah | H05K 1/144 |
| | | | 361/784 |

* cited by examiner

HOT SWAPPING TECHNIQUE FOR EXPANSION CARDS

CROSS-REFERENCE TO RELATED APPLICATIONS

This application is a continuation of the co-pending U.S. patent application titled, "HOT SWAPPING TECHNIQUE FOR EXPANSION CARDS," filed on Aug. 10, 2017 and having Ser. No. 15/674,461. The subject matter of this related application is hereby incorporated herein by reference.

BACKGROUND

Field of the Embodiments

The various embodiments relate generally to human-machine interfaces and, more specifically, to a hot swapping technique for expansion cards.

Description of the Related Art

Expansion cards dramatically increase the computational power of a central processing unit (CPU). For example, a graphics card could be mounted to a motherboard to facilitate the CPU in rapidly processing computationally intensive 3D graphics tasks. Expansion cards can also boost the storage space on a hard drive. For instance, a solid state drive (SSD) could be internally mounted to a motherboard to boost the available storage capacity of the primary hard drive and/or one or more data hard drives. Furthermore, expansion cards can also add additional functionalities to a CPU. For example, a network card could be internally mounted to a motherboard to facilitate the CPU in transmitting data over particular types of networks.

A motherboard is the main printed circuit board of a computer. Motherboards typically include a variety of expansion slots into which expansion cards can be inserted or mounted. In particular, various expansion cards can be inserted into expansion slots associated with Peripheral Component Interconnects (PCIs), PCI express, Accelerated Graphics Ports (AGPs), and so forth. In addition, an expansion bus facilitates I/O operations between the CPU and one or more expansion cards.

Hot swapping is the process of removing an expansion card from an expansion slot and inserting another expansion card into the expansion slot while power is being supplied to the motherboard. Expansion cards that can be hot swapped have a variety of advantages over expansion cards that cannot be hot swapped. For instance, if a hardware failure occurs on an expansion card, hot swappable expansion cards can be removed and/or exchanged with another hot swappable expansion card, while power is supplied to the motherboard. Thus, other processes running on the motherboard can continue without interruption despite the hardware failure of an expansion card. Alternatively, in expansion cards that cannot be hot swapped, power is turned off to the motherboard before removing the expansion card and/or adding another expansion card. Turning off power to the motherboard interrupts and/or terminates other processes running on the motherboard, such as processing jobs running in the central processing unit. Another advantage of hot swapping is that various types of hot swappable expansion cards can be exchanged with each other between CPU operations, thereby providing different types of additional computational and storage capabilities to the CPU while the CPU performs other processing operations.

M.2 is a specification for expansion cards that cannot be hot swapped. In particular, a user must turn off the power supply to the motherboard before inserting or removing an M.2 expansion card from an expansion slot. Turning off the power supply to the motherboard stops the CPU and any other devices and expansion cards powered by the motherboard from performing processing tasks. Thus, even though expansion cards satisfying the M.2 specification are desirable for their small form factor and processing power, these expansion cards can be inconvenient in practice due to the lack of hot swapping functionality.

As the foregoing illustrates, techniques for enabling hot swapping in M.2 expansion cards would be useful.

SUMMARY

Embodiments of the present disclosure set forth a system for hot swapping an expansion card. The system includes a fastener mechanism for coupling an expansion card to a motherboard. The system further includes a switch for controlling voltage supply to the expansion card. When the fastener mechanism is in an activated state, the fastener mechanism secures the expansion card to the motherboard and the switch causes voltage to be supplied to the expansion card. When the fastener mechanism is in a partially activated state, the fastener mechanism secures the expansion card to the motherboard and the switch prevents voltage from being supplied to the expansion card.

Further embodiments provide, among other things, a method for implementing the techniques set forth above.

At least one advantage of the techniques described herein is that an expansion card can be inserted and/or removed from an expansion slot in a motherboard without shutting off power to the motherboard. The techniques described herein reduce the likelihood of hardware damage that can occur when expansion cards are improperly hot swapped. In addition, these techniques protect data integrity in storage devices. As a result, users can more easily configure a computer by adding and removing expansion cards from a motherboard, while the CPU, other processing units, and expansion cards coupled to the motherboard perform processing tasks.

BRIEF DESCRIPTION OF THE SEVERAL VIEWS OF THE DRAWINGS

So that the manner in which the recited features of the one or more embodiments set forth above can be understood in detail, a more particular description of the one or more embodiments, briefly summarized above, may be had by reference to certain specific embodiments, some of which are illustrated in the appended drawings. It is to be noted, however, that the appended drawings illustrate only typical embodiments and are therefore not to be considered limiting of its scope in any manner, for the scope of the various embodiments subsumes other embodiments as well.

DETAILED DESCRIPTION

Various types of expansion cards are unable to be hot unplugged or hot plugged. For example, expansion cards built according to the M.2 standard cannot be hot plugged or hot unplugged. A fastening mechanism that allows such expansion cards to be hot unplugged or hot plugged is discussed below.

With respect to hot unplugging, the fastener mechanism secures the expansion card to a motherboard, and, while the expansion card is still secured to the motherboard, a sensor detects an impending unplugging of the expansion card. In response, the sensor triggers a power down sequence during which the voltage supply to the expansion card is turned off and, to maintain data integrity, input/output (1/0) operations occurring with the expansion card are stopped. In addition, a notification is displayed when the expansion card can be safely removed from the motherboard. With respect to hot plugging, a sensor detects that an expansion card is being inserted into an expansion slot. In response the sensor triggers a power up sequence during which a voltage supply is provided to the expansion card and the expansion card is configured to perform I/O operations. In addition, a notification is displayed that indicates that the expansion card is turned on.

Powering down in response to an impending unplugging event and powering up in response to an impending hot plugging event occurs automatically without relying on user intervention. A user, therefore, can hot unplug and hot plug an expansion card in a similar manner to the way the user typically unplugs and plugs the expansion card when the motherboard is powered off.

Figure 1A:
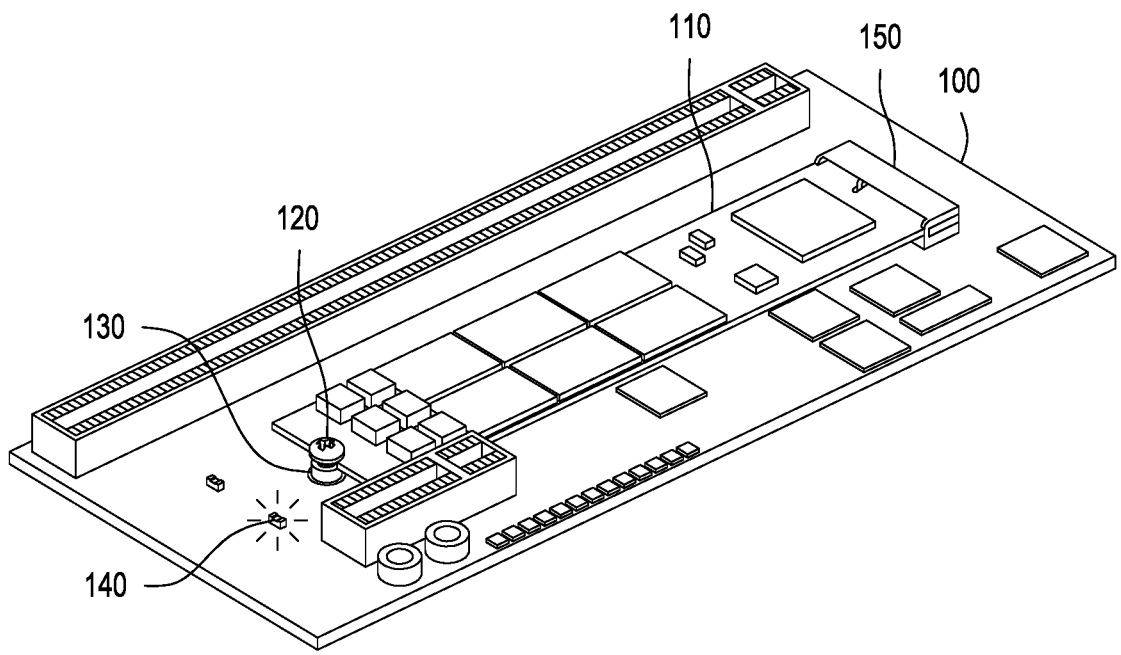
FIGS. 1A and 1B illustrate a system configuration for implementing various embodiments of the present disclosure.
Figure 1B:
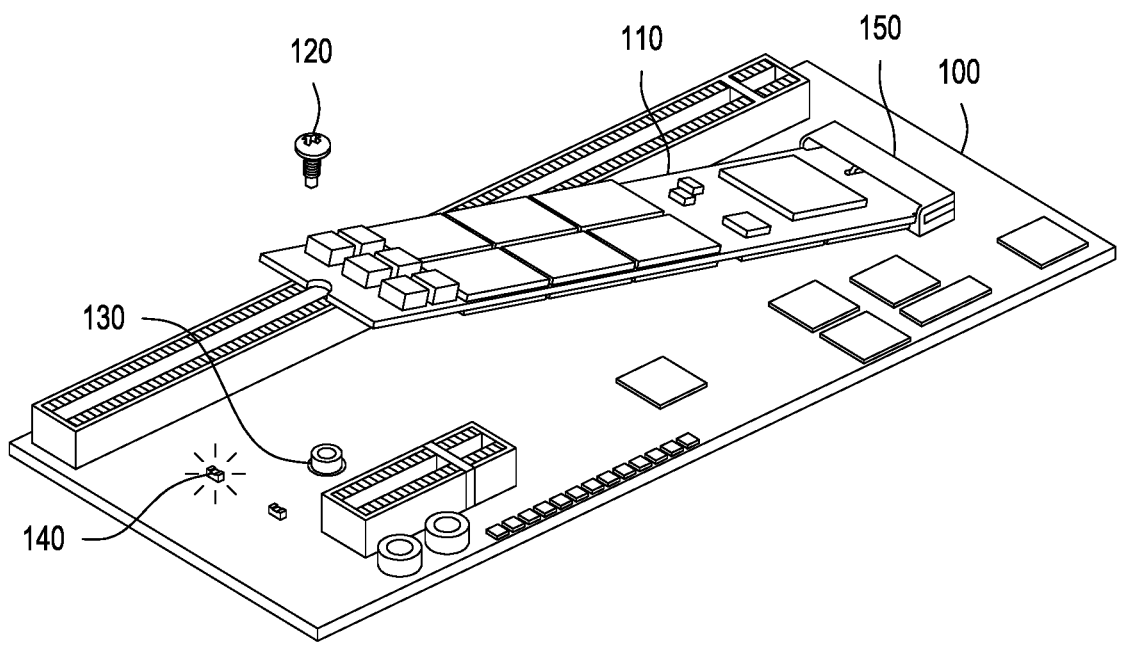

FIGS. 1A and 1B illustrate a system configuration for implementing various embodiments of the present disclosure. As shown, motherboard 100 includes expansion card 110, fastener 120, sensor 130, indicator light 140, and expansion slot 150. Motherboard 100 includes any type of printed circuit board that can coordinate the transfer of data, commands, and electricity to various elements and devices coupled to motherboard 100. Expansion slot 150 includes receptacle connectors that facilitate the transfer of data, commands, and electricity between motherboard 100 and expansion card 110.

Expansion card 110 includes any type of printed circuit board that can be internally mounted onto motherboard 100. Expansion card 110 may include storage devices, graphics cards, long term evolution (LTE) modules, network cards, sound cards, modem cards, solid state drives (SSDs), and so forth. Expansion card 110 includes a set of connector pins that can be connected to receptacle connectors in expansion slot 150. The connector pins facilitate the transfer of a voltage supply to expansion card 110. In addition, the connector pins facilitate input and output (1/0) operations between the expansion cards and processing units coupled to motherboard 100. For example, expansion card 110 could receive processing tasks from a central processing unit (CPU). Once the processing task is completed, expansion card 110 could transmit a notification and/or the results of the processing task to the CPU via an expansion bus.

Fastener mechanism 120 includes any type of device that is capable of securing expansion card 110 to motherboard 100. Fastener mechanism 120 can operate in a variety of states, including an activated state and a deactivated state. In the activated state, fastener 120 secures expansion card 110 to motherboard 100. In the deactivated state, fastener 120 does not secure expansion card 110 to motherboard 100. In particular, in the deactivated state, expansion card 110 can be removed from motherboard 100 by removing the connector pins of expansion card 110 from the receptacle pins of expansion slot 150.

In some embodiments, fastener mechanism 120 includes a primary fastener and a secondary fastener that can each be independently activated or deactivated. In one embodiment, when securing expansion card 110 to motherboard 100, the secondary fastener is activated on expansion card 110. The secondary fastener secures expansion card 110 until the primary fastener transitions from the deactivated state to the activated state. When removing expansion card 110, the primary fastener is deactivated while the secondary fastener secures expansion card 110 to motherboard 100. Once the primary fastener is deactivated, the secondary fastener is deactivated, which releases expansion card 110 from motherboard 100. Expansion card 110 can then be removed from expansion slot 150.

In one embodiment, the primary fastener could include a screw and the secondary fastener could include a spring-washer system that is coupled to the screw. The spring-washer system may be located under the head of the screw, such as around the shank and/or thread of the screw. The screw is inserted into motherboard 110 proximate to expansion card 110 such that the screw head overlaps part of expansion card 110. As the screw is tightened, the spring-washer system compresses, thereby applying pressure on expansion card 110 to secure expansion card 110 to motherboard 100. Once the screw is completely tightened, the spring-washer system is fully compressed between the screw head and expansion card 110. In this manner, the screw head secures expansion card 110 to motherboard 100. When removing expansion card 110 from motherboard 100, the screw is loosened from expansion card 110. As the screw is loosened, the spring-washer system extends, thereby securing expansion card 110 to motherboard 100 by applying pressure to expansion card 110. When the spring-washer system is fully extended and the screw removed from motherboard 100, expansion card 110 is unsecured. Expansion card 110 can be removed from expansion slot 150 by removing the connector pins in expansion card 110 from the receptacle pins in expansion slot 150.

Sensor 130 includes any type of device that can detect a state of fastener mechanism 120. In particular, sensor 130 may include a pressure sensor, a visual sensor, a depth sensor, a contact sensor, and so forth. For example, one or more pressure sensors may be located proximate to fastener mechanism 120. The pressure sensor may detect the state of fastener mechanism 120 by detecting if one or more fasteners in fastener mechanism 120 are exerting a force on a region of motherboard 100 that is proximate to the pressure sensor. In one embodiment, sensor 130 may detect whether fastener mechanism 120 is activated. In response to detecting that fastener mechanism 120 is activated, sensor 130 may generate a notification. The notification could travel through one or more traces in motherboard 100 and/or an expansion bus toward the CPU. The notification may indicate to the CPU that expansion card 110 is secured. The notification may also indicate that the CPU can initial I/O operations with expansion card 110. For example, CPU could send a processing task to expansion card 110 via an expansion bus connected to expansion slot 150. In various embodiments, when sensor 130 detects that fastener mechanism 120 is deactivated, sensor 130 may generate a notification that indicates that the CPU should cease performing I/O operations with expansion card 110.

Indicator 140 includes any device that can generate an indication when a voltage is supplied to expansion card 110. In particular, indicator 140 may include a visual indicator, a haptic indicator, an auditory indicator, and so forth. In one embodiment, indicator 140 may be in one of two states. In particular, indicator 140 may be in a first state when a voltage is not being supplied to expansion card 110. Indicator 140 may be in a second state when a voltage is supplied to expansion card 110. When the indicator 140 is in the first state, a user may determine that expansion card 110 should not be inserted or removed from expansion slot 150 because a voltage is being supplied to expansion card 110 via one or more receptacle connectors in expansion slot 150. When indicator 140 is in a second state, a user may determine that expansion card 110 can be inserted into expansion slot 150 because a voltage is not being supplied to expansion card 110 via receptacle connectors in expansion slot 150.

In one embodiment, indicator 140 may include a two-color light-emitting diode (LED) display. When a voltage is supplied to expansion card 110, a first color is displayed by the LED display. When the voltage is not supplied to expansion card 110, a second color is displayed by the LED display. In various embodiments, when fastener mechanism 120 is activated, fastener mechanism 120 could close a switch in a circuit that causes a voltage to be supplied to expansion card 110. In addition, closing the switch could supply power to a first LED that displays the first color. When fastener mechanism 120 is deactivated, fastener mechanism 120 may open the switch. Opening the switch may turn off the voltage supply to expansion card 110 and may further supply power to a second LED that displays the second color.

FIG. 1A illustrates fastener mechanism 120 in an activated state. In the activated state, fastener mechanism 120 secures expansion card 110 to motherboard 100. In addition, connector pins in expansion card 110 are connected with receptacle connectors in expansion slot 150 and a voltage is supplied to expansion card 110 via the receptacle connectors in expansion slot 150. In various embodiments, fastener mechanism 120 closes a switch that causes a voltage to be supplied to expansion card 110 via the receptacle connectors. In addition, indicator 140 is in an "on" state, which indicates that a voltage is being supplied to expansion card 110. Furthermore, sensor 130 detects that fastener mechanism 120 is activated. Sensor 130 generates a notification that indicates that the CPU can perform 1/0 operations with expansion card 110.

FIG. 1B illustrates fastener mechanism 120 in a deactivated state. In the deactivated state, fastener mechanism 120 does not secure expansion card 110 to motherboard 120. Expansion card 110 can be removed from expansion slot 150 and a voltage is not supplied to expansion card 110 via receptacle connectors in expansion slot 150. In various embodiments, when fastener mechanism 120 is deactivated, a switch in a circuit opens, thereby turning off the voltage supply to expansion card 110. In addition, indicator 140 is in an "off" state, which indicates that a voltage is not supplied to expansion card 110. Furthermore, sensor 130 detects that fastener mechanism 120 is deactivated. Sensor 130 generates a notification that indicates that the CPU should not perform 1/0 operations with expansion card 110.

Figure 2:
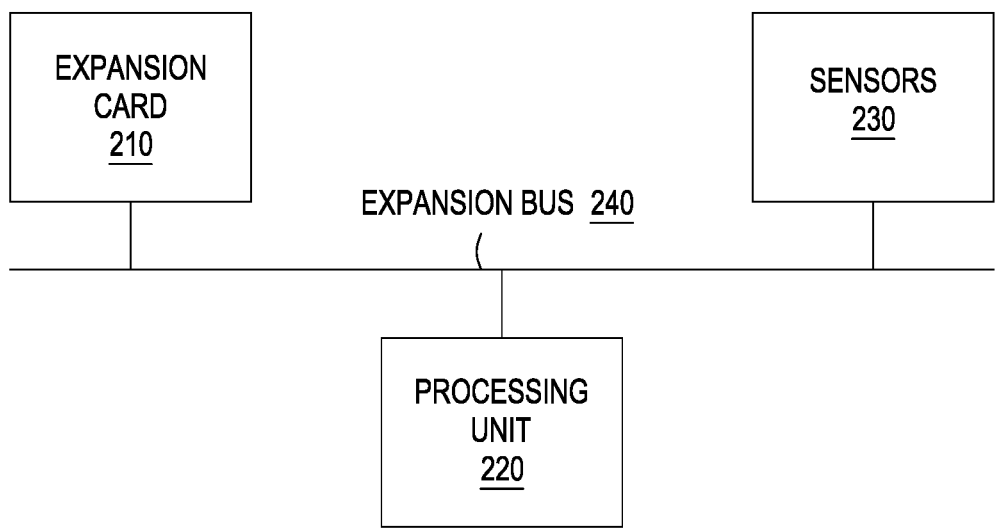
FIG. 2 illustrates an expansion bus that coordinate the transfer of data between various devices on a motherboard via interconnects, according to various embodiments.

FIG. 2 illustrates an expansion bus 240 that coordinates the transfer of data between various devices on a motherboard via interconnects. Expansion bus 240 coordinates the transfer of data between expansion card 210, processing unit 220, and sensors 230. Expansion bus 240 may include a peripheral component interconnect (PCI), a peripheral component interconnect (PCI) express, a non-volatile memory (NVM) express, and so forth.

In one embodiment, when expansion card 210 is inserted into an expansion slot and a voltage is supplied to expansion card 210, a driver associated with expansion bus 240 identifies expansion card 210 and generates a notification that is transmitted via expansion bus 240 to processing unit 220. The notification may indicate one or more parameters of expansion card 210. For instance, the notification could include the type of expansion card, the size of the expansion card, the thermal design point of the expansion card, and so forth. In addition, when the fastener mechanism is activated, sensors 230 generate and transmit a notification via expansion bus 240 that indicates that the processing unit 220 can perform I/O operations with expansion card 210. For example, processing unit 220 could transmit graphics processing tasks to a graphics card located on expansion bus 240.

When the fastener mechanism is deactivated, sensors 230 generate and transmit a notification via expansion bus 240 to processing unit 220. The notification indicates that processing unit 220 should not perform I/O operations with expansion card 210. In addition, when a voltage is not supplied to expansion card 210, the driver associated with expansion bus 240 may cease to recognize expansion card 210. In addition, the driver may transmit a notification to processing unit 220 that indicates that the driver no longer recognizes expansion card 210.

Figure 3A:
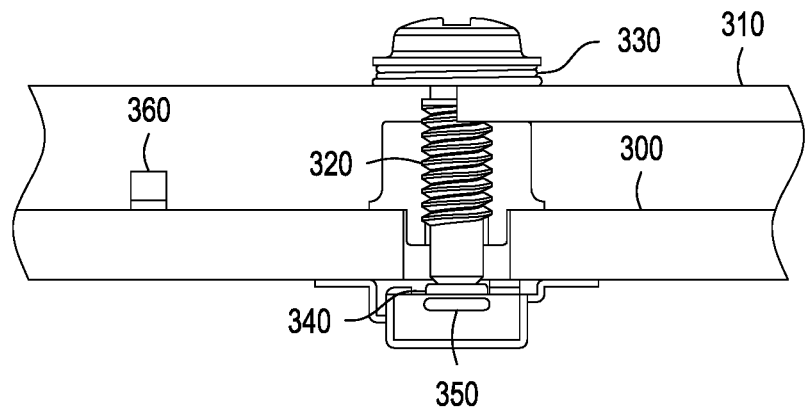
FIGS. 3A-3C illustrate a fastener mechanism for hot unplugging expansion card 310 from motherboard 300, according to various embodiments.
Figure 3B:
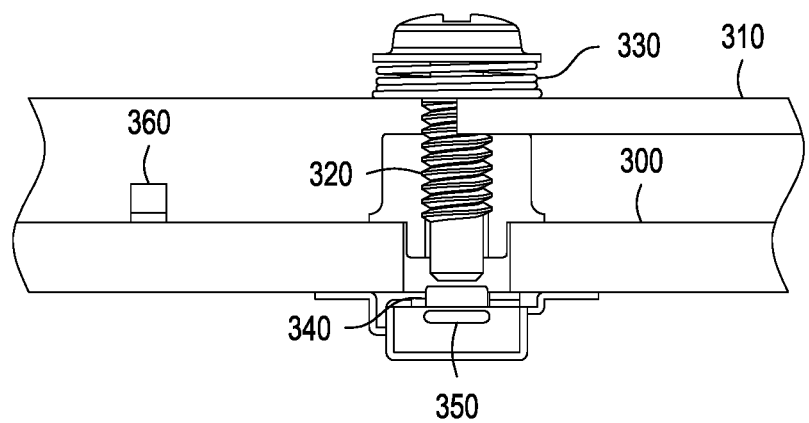
Figure 3C:
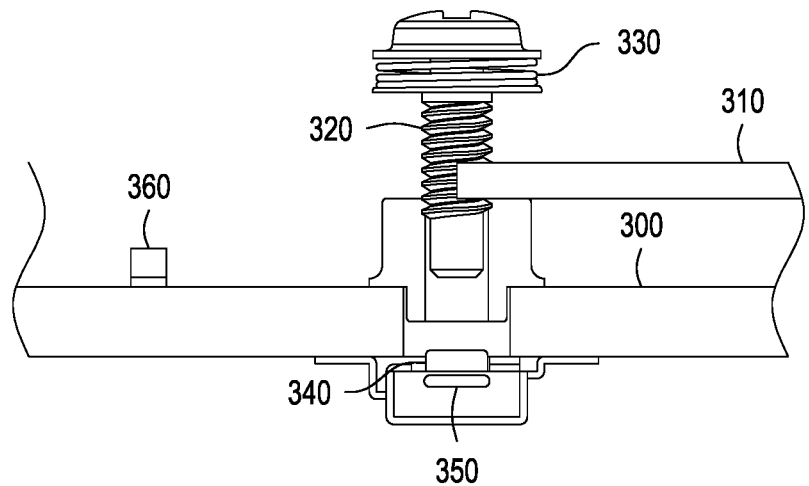

FIGS. 3A-3C illustrate a fastener mechanism for hot unplugging expansion card 310 from motherboard 300, according to various embodiments. The fastener mechanism 320 and 330 includes primary fastener 320 and secondary fastener 330. In particular, primary fastener 320 includes a screw and secondary fastener 330 includes a spring-washer system. Motherboard 300 also includes switch 340, sensor 350, and indicator 360.

In FIG. 3A, primary fastener 320 is activated and secondary fastener 330 is activated. In particular, when secondary fastener 330 is activated, secondary fastener 330 applies pressure on expansion card 310, thereby securing expansion card 310 to motherboard 300. When primary fastener 320 is activated, primary fastener 320 also applies pressure on expansion card 310 thereby securing expansion card 310 to motherboard 300. In addition, when primary fastener 320 is activated, primary fastener 320 closes switch 340. Switch 340 is a circuit element in a circuit that provides a voltage supply to expansion card 310. When primary fastener 320 closes switch 340, a voltage is supplied to expansion card 310. In various embodiments, indicator 360 is associated with switch 340. When primary fastener 320 closes switch 340, a voltage is supplied to indicator 360 causing indicator 360 to display a notification. The notification could indicate to the user that a voltage is being supplied to expansion card 310.

In addition, motherboard 300 includes sensor 350. Sensor 350 detects the state of primary fastener 320. In particular, in FIG. 3A, sensor 350 detects that primary fastener 320 is activated. In response to detecting that primary fastener 320 is activated, sensor 350 may generate a notification that indicates that I/O operations can be performed with expansion card 310. Sensor 350 may be connected to an expansion bus on motherboard 300 and may transmit the notification via the expansion bus. In addition, the notification generated by sensor 350 may configure a driver associated with the expansion bus to initiate device recognition protocols with expansion card 310.

In FIG. 3B, the fastener mechanism is partially activated. In such a state, primary fastener 320 is deactivated, but secondary fastener 330 is activated. When primary fastener 320 is deactivated, primary fastener 320 does not close switch 340. As a result, switch 340 is open. When switch 340 is open, the circuit associated with switch 340 does not provide a voltage supply to expansion card 310. In various embodiments, one or more capacitors included on expansion card 310 discharge. The discharging capacitor(s) may provide a voltage supply to expansion card 310 for a limited time. In addition, one or more capacitors located on the circuit may provide a voltage supply to expansion card 310 for a limited time. Such voltage supplies may facilitate expansion card 310 in initiating and completing power-down protocols. Power-down protocols may include completing I/O operations with the CPU, completely processing tasks, and/or emptying one or more local caches located on expansion card 310.

In various embodiments, when switch 340 opens, indicator 360 may change. For example, indicator 360 could exhibit a visual change, such as a change in color. Additionally or alternatively, indicator 360 could generate an auditory sound or notification, could generate a haptic sensation or notification, and so forth. In various embodiments, indicator 360 does not change state until expansion card 310 completes one or more power-down protocols.

Furthermore, sensor 350 detects when primary fastener 320 is deactivated. In one embodiment, sensor 350 is a pressure sensor. When primary fastener 320 deactivates, sensor 350 could detect a decrease in pressure due to the change in position of primary fastener 320. Additionally or alternatively, sensor 320 detects a vibration associated with primary fastener deactivating and/or a visual sensor detects that the position of primary fastener 320 changed. When sensor 350 detects that primary fastener 320 is deactivated, sensor 350 generates a notification that indicates that I/O operations with expansion card 310 should cease. Sensor 350 could transmit the notification via an expansion bus to a driver that facilitates device recognition and/or I/O operations with expansion card 310, to the CPU, and/or to any device performing I/O operations with expansion card 310.

In addition, while primary fastener 320 is deactivated, secondary fastener 330 secures expansion card 310 to motherboard 300. In particular, a spring-washer system extends between screw head and expansion card 310. The spring-washer system exerts a force on expansion card 310, thereby securing expansion card 310 to motherboard 300.

In FIG. 3C, primary fastener 320 is removed from expansion card 310. Removing primary fastener 320 from expansion card 310 deactivates secondary fastener 330. When secondary fastener 330 is deactivated, expansion card 310 can be removed from motherboard 300. In particular, in FIG. 3C, the spring-washer system included in secondary fastener 330 is not in contact with expansion card 310. Thus, no mechanical force is transmitted by the spring-washer system to expansion card 310.

In addition, switch 340 is open, sensor 350 detects that primary fastener 320 is deactivated, and indicator 360 changes in order to indicate that a voltage is not supplied to expansion card 310. In various embodiments, when indicator 360 changes, secondary fastener 330 can be safely deactivated. In other embodiments, indicator 360 changes in response to secondary fastener 330 deactivating. In yet a third embodiment, there is no correlation between secondary fastener 330 and indicator 360. In such embodiments, the indicator 360 may changes in response to the voltage supply to expansion card 310 being turned off In other embodiments, the indicator 360 changes in response to expansion card 310 ceasing I/O operations.

When expansion card 310 is hot plugged, the steps of the technique are implemented in reverse order. In particular, prior to being hot plugged, expansion card 310 is located proximate to motherboard 300. In addition, primary fastener 320 and secondary fastener 330 are inserted into motherboard 300 proximate to expansion card 310. Switch 340 is open, sensor 350 detects that primary fastener 320 is deactivated, and indicator 360 indicates that a voltage is not supplied to expansion card 310. When the secondary fastener 330 is activated, secondary fastener 330 secures expansion card 310 to motherboard 300. In addition, switch 340 is open, sensor 350 detects that primary fastener 320 is deactivated, and indicator 360 indicates that a voltage is not supplied to expansion card 310.

When primary fastener 310 is activated, primary fastener secures expansion card 310 to motherboard 300. In addition, when primary fastener 320 is activated, primary fastener 320 closes switch 340. Closing switch 340 supplies a voltage to expansion card 310. In addition, closing a switch 340 supplies a voltage to indicator 360. When a voltage is supplied to indicator 360, one or more aspects of indicator 360 change. For example, indicator 360 could generate an audio tone for a certain time interval. Furthermore, sensor 350 detects that primary fastener is activated, and in response generates a notification. The notification may indicate that I/O operations may be conducted with expansion card 310. Sensor 350 may transmit the notification via an expansion bus on motherboard 300 to a device driver associated with the expansion bus, to the CPU, and/or to devices that may perform I/O operations with expansion card 310. A driver associated with an expansion bus may configure expansion card 310 to perform I/O operations with various devices on motherboard 300.

Figure 4:
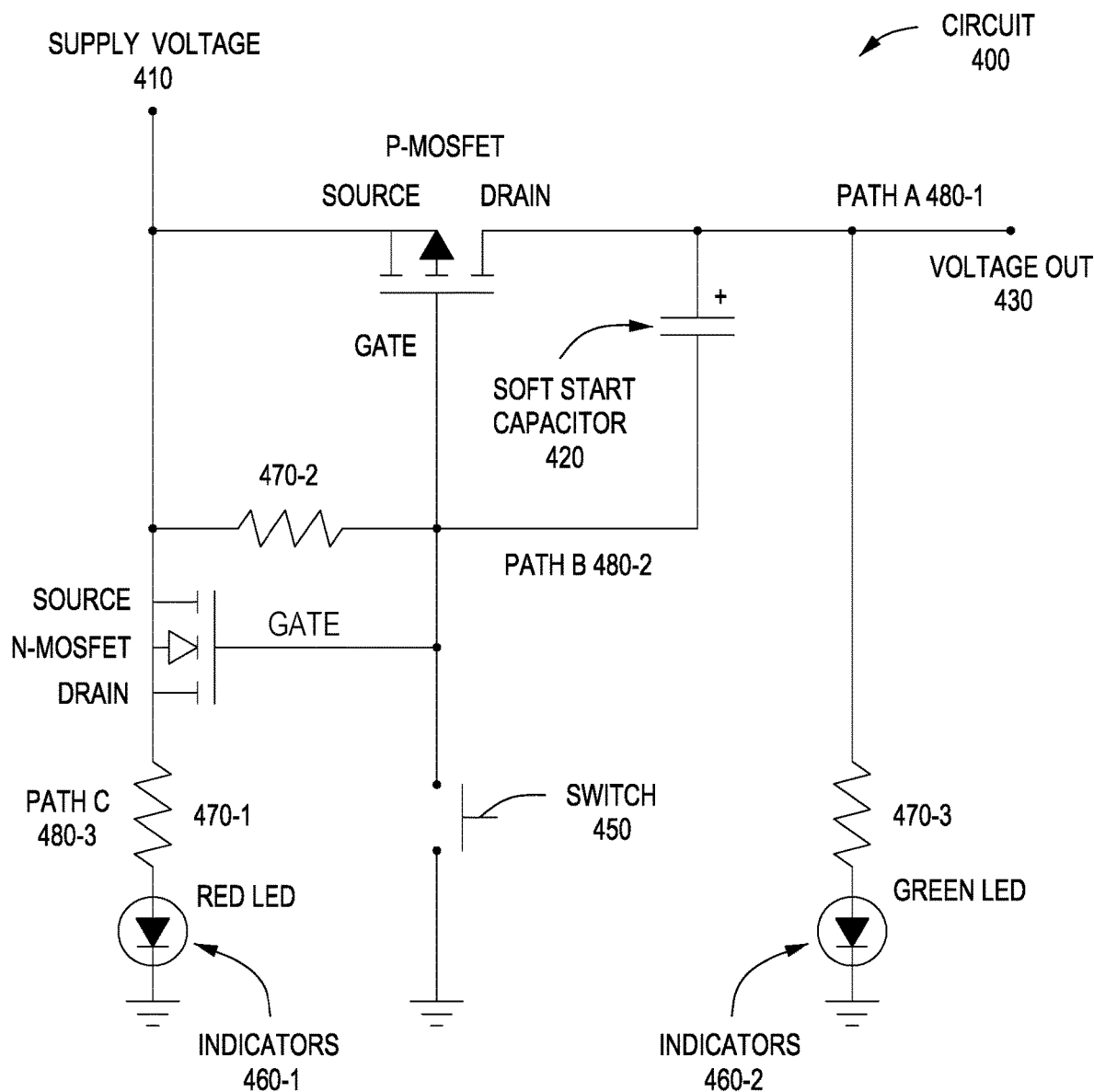
FIG. 4 illustrates an example circuit for moderating the voltage supplied to expansion card 310, according to various embodiments.

FIG. 4 illustrates an example circuit for moderating the voltage supplied to expansion card 310, according to various embodiments. As shown, circuit 400 includes supply voltage 410, soft start capacitor 420, switch 450, indicator 460-1, indicator 460-2, and a negative metal-oxide-semiconductor field-effect transistor (N-MOSFET) and a positive MOSFET (P-MOSFET).

Supply voltage 410 may be provided by motherboard 300. Typically, supply voltage 410 is at 3.3 Volts or 5 Volts. In other embodiments, any voltage that can power expansion card 310 is within the scope of the present disclosure. Supply voltage 410 provides the voltage supply to circuit 400. In addition, voltage out 430 is the voltage supply to expansion card 310.

In various embodiments, indicator 460-1 and indicator 460-2 are any type of circuit element that can generate an indication in response to current flowing to indicator 460-1 and indicator 460-2, respectively. In one embodiment, indicator 460-1 is "on" when current flows to indicator 460-1. Indicator 460-1 is "off" when current does not flow to indicator 460-1. Similarly, indicator 460-2 is "on" when current flows to indicator 460-2. Indicator 460-2 is "off" when current does not flow to indicator 460-2. In one embodiment, indicator 460-1 is a red light emitting diode (LED) and indicator 460-2 is a green LED. When current is supplied to indicator 460-1, a red light is emitted, and, when current is supplied to indicator 460-2, a green light is emitted.

N-MOSFET and P-MOSFET each include a source voltage, a drain voltage, and a gate voltage. In circuit 400, supply voltage 410 provides the source voltage to both the N-MOSFET and the P-MOSFET. Switch 450 moderates the gate voltage of both the N-MOSFET and the P-MOSFET by connecting the gate of the P-MOSFET and the gate of the N-MOSFET to ground or disconnecting the gate of the P-MOSFET and the gate of the N-MOSFET from ground. The drain voltage of the N-MOSFET provides a voltage supply to indicator 460-1. The drain voltage of the P-MOSFET provides a voltage supply to expansion card 310, via voltage out 430. The drain of the P-MOSFET also provides the voltage supply to indicator 460-2.

When switch 450 is closed, the gate of the N-MOSFET is connected to ground and the gate of the P-MOSFET is connected to ground. The P-MOSFET facilitates the flow of current from supply voltage 410 to voltage out 430. In particular, the P-MOSFET and the N-MOSFET short circuit resistors 470-1 and 470-2, thereby facilitating the flow of current from supply voltage 410 to voltage out 430 and indicator 460-2. The current flow to indicator 460-2 causes indicator 460-2 to generate an indication (e.g., emitting green light), while the current flow to voltage out 430 provides a voltage supply to expansion card 310. In addition, the voltage supply to expansion card 310 may cause expansion card 310 to power on and cause one or more drivers associated with expansion bus 240 to initiate device recognition protocols and to configure expansion card 310 to perform 1/0 operations with various other devices on motherboard 300.

When switch 450 is open, the gate of the N-MOSFET is not connected to ground and the gate of the P-MOSFET is not connected to ground. P-MOSFET inhibits the flow of current along path A 480-1. Soft start capacitor 420 moderates the flow of current along path B 480-2. In particular, when switch 450 opens, charge builds on the capacitor plates in soft start capacitor 420. Initially, the charge build-up is small, which allows current to flow along path B 480-2 with minimal resistance. However, as current continues to flow, the charge build-up on the capacitor walls increases, thereby increasing the resistance along path B 480-2 to the flow of current. As the charge build-up approaches a maximum amount that can be contained by the plates of soft start capacitor 480-2, the flow of current approaches a minimum, thereby cutting off current flow along path B 480-2. In this manner, when switch 450 opens, current flow to voltage out 430 and indicator 460-2 is reduced, thereby turning off the voltage supply to expansion card 310 via voltage out 430 and turning off indicator 460-2, respectively. In particular, the magnitude of the indication generated by indicator 460-2 may decrease or increase in proportion to the magnitude of the current flow to indicator 460-2.

In addition, when switch 450 is open, N-MOSFET facilitates the flow of current to indicator 460-1. In response to current flowing to indicator 460-1, indicator 460-1 generates an indication (e.g., emitting red light). In particular, as soft start capacitor 420 charges, the resistance along path B 480-2 increases while the resistance along path C 480-3 remains effectively constant. Thus, as soft start capacitor 420 charges, the voltage supply to indicator 460-1 increases. The voltage supply to indicator 460-1 approaches a maximum as the charge on the capacitor plates of soft start capacitor 420 reaches a maximum value. In particular, the magnitude of the indication generated by indicator 460-2 may be proportional to the amount of current that flows to indicator 460-1. In particular, the magnitude of the indication generated by indicator 460-1 may increase or decrease in proportion to the magnitude of the current flow to indicator 460-1.

Figure 5:
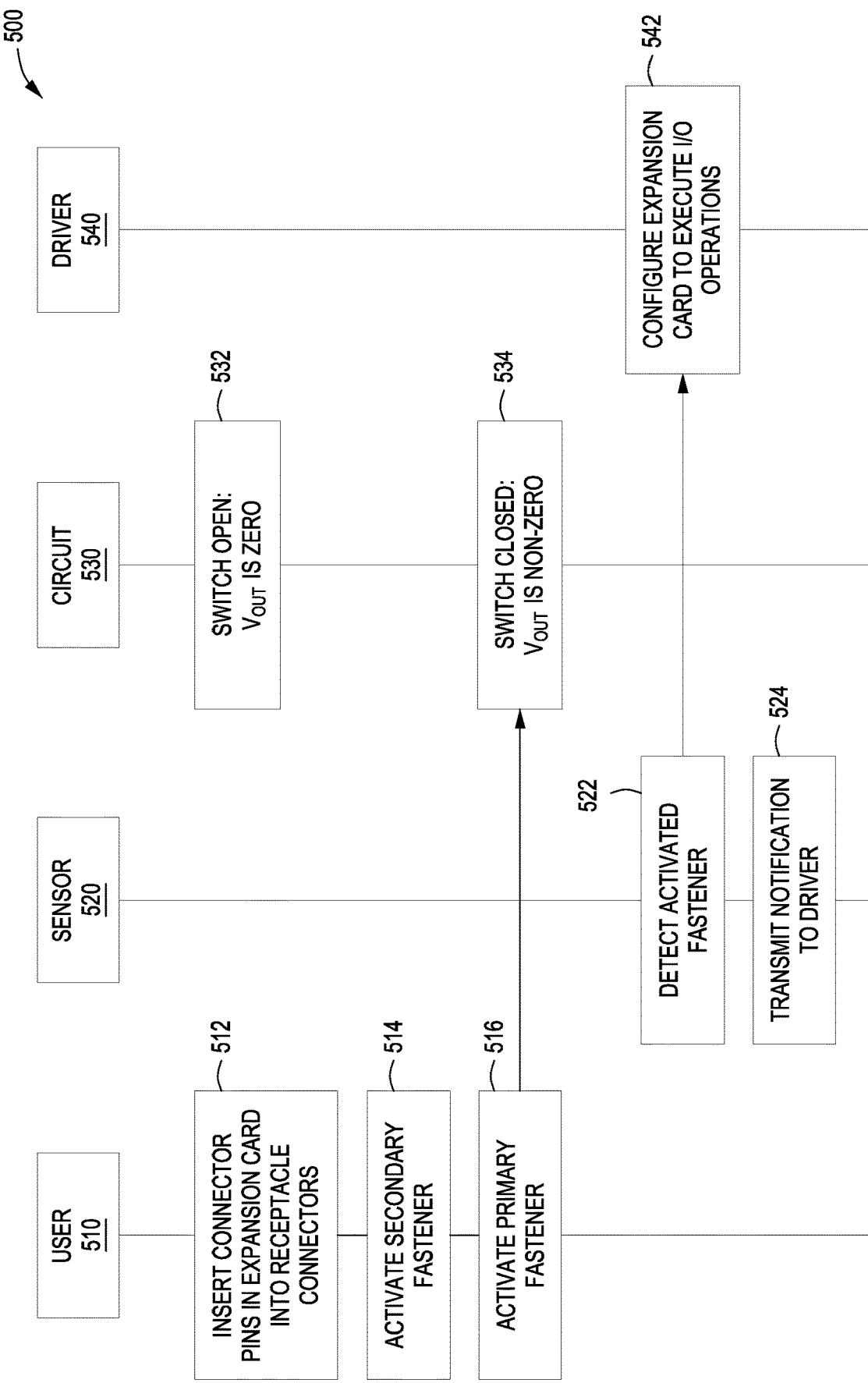
FIG. 5 illustrates a timing diagram of method steps for hot plugging an expansion card, according to various embodiments.

FIG. 5 illustrates a timing diagram of method steps for hot plugging an expansion card, according to various embodiments. As shown, the timing diagram 500 includes a user 510, a sensor 520, a circuit 530, and a driver 540. Although the timing-diagram steps are described in conjunction with the system of FIGS. 1-4, persons skilled in the art will understand that any system configured to perform the timing diagram steps falls within the scope of the present invention.

At step 520, switch 450 is open and voltage is not supplied to the receptacle pins in expansion slot 150. In particular, one or more circuit elements in circuit 530 inhibit the flow of current from motherboard 100 to the receptacle pins in expansion slot 150. In addition, indicator 460-1 is "on" and indicator 460-2 is "off". In one embodiment, indicator 460-1 emits a red light when "on" to indicate that a voltage is not supplied to the receptacle pins in expansion slot 150.

At step 512, user 510 inserts connector pins of expansion card 110 into receptacle connectors in expansion slot 150. At step 514, user 510 activates secondary fastener 330. In various embodiments, secondary fastener 330 secures expansion card 110 to motherboard 100. When primary fastener 320 is deactivated and secondary fastener 330 is activated, the fastener mechanism as a whole is partially activated. At step 516, user 510 activates primary fastener 320. At step 534, switch 450 closes in response to user 510 activating primary fastener 520. Closing switch 450 diverts the flow of current from indicator 460-1 towards voltage out 430 and indicator 460-2. Current flow to voltage out 430 provides a voltage supply to the receptacle pins in expansion slot 150. Current flow to indicator 460-2 causes indicator 460-2 to generate an indication that a voltage supply is provided to one or more receptacle pins in expansion slot 150, thereby supplying a voltage to expansion card 110. In one embodiment, indicator 460-2 displays the indication by emitting green light.

At step 522, sensor 520 detects that primary fastener 320 is activated. In response, sensor 520 generates a notification that indicates that primary fastener 320 is activated. At step 524, sensor 520 transmits the notification via expansion bus 240 to driver 540. In some embodiments, sensor 520 also transmits the notification to a CPU and/or other devices that can perform 1/0 operations with expansion card 110. At step 542, in response to receiving the notification from sensor 520, driver 540 identifies the type of expansion card 110 present in expansion slot 150 and configures expansion card 110 to perform 1/0 operations with the CPU and/or other devices on motherboard 100.

Figure 6:
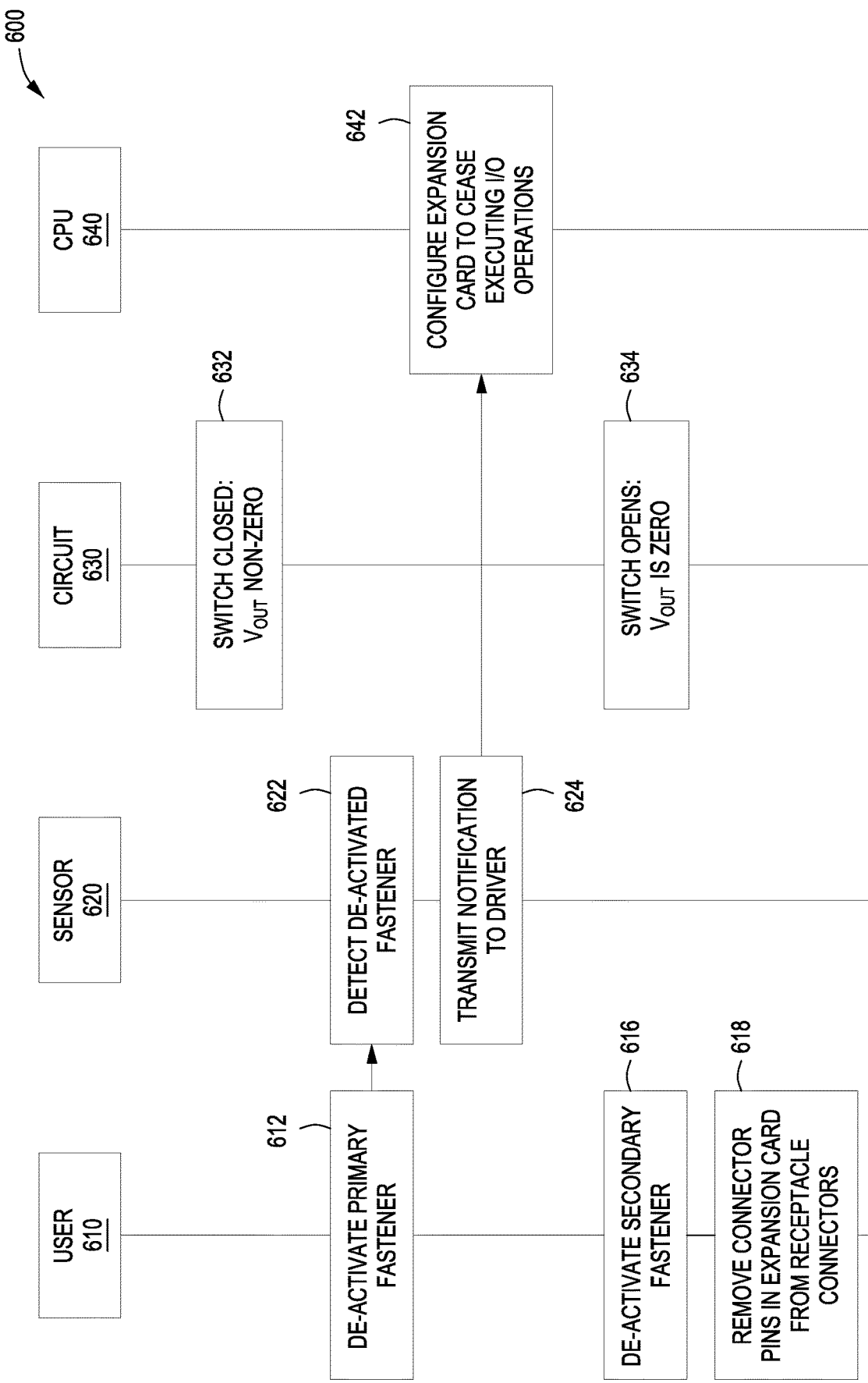
FIG. 6 illustrates a timing diagram of method steps for hot unplugging expansion card 110, according to various embodiments.

FIG. 6 illustrates a timing diagram of method steps for hot unplugging expansion card 110, according to various embodiments. As shown, timing diagram 600 includes a user 610, a sensor 620, a circuit 630, and a driver 640. Although the timing-diagram steps are described in conjunction with the system of FIGS. 1-4, persons skilled in the art will understand that any system configured to perform the timing diagram steps falls within the scope of the present invention.

At step 634, switch 450 is closed and voltage is supplied to expansion card 110 via one or more receptacle pins in expansion slot 150. In particular, one or more circuit elements in circuit 630 facilitate the flow of current from motherboard 100 to the receptacle pins in expansion slot 150. In addition, indicator 460-2 is "on" and indicator 460-1 is "off". In one embodiment, indicator 460-2 emits a green light when "on" to indicate that a voltage is supplied to the receptacle pins in expansion slot 150.

At step 612, user 610 deactivates primary fastener 320. When primary fastener 320 is deactivated and secondary fastener 330 is activated, the fastener mechanism as a whole is partially activated. Sensor 620 detects that primary fastener 622 is deactivated and generates a notification that indicates that I/O operations with expansion card 110 should cease. At step 624, sensor 620 transmits the notification to driver 640 via expansion bus 240. Sensor 620 may further transmit the notification to the CPU and/or other devices that can perform I/O operations with expansion card 110. In response to receiving the notification, driver 640 configures expansion card 110 to cease performing 1/0 operations.

In addition, at step 634, in response to primary fastener 320 deactivating, switch 450 opens. In various embodiments, when switch 450 opens, the voltage supply to expansion card 110 is turned off. In other embodiments, when switch 450 opens, the voltage supply to expansion card 110 turns off gradually over a period of time. In addition, indicator 460-1 may generate an indication that the voltage supply to expansion card 110 is turned off. For example, when switch 450 opens, one or more circuit elements may divert the flow of current from receptacle connectors in expansion slot 150 to indicator 460-1.

At step 616, in response to indicator 460-1, user 610 deactivates secondary fastener 330. At step 618, user 610 removes expansion card 110 from expansion slot 150.

Figure 7:
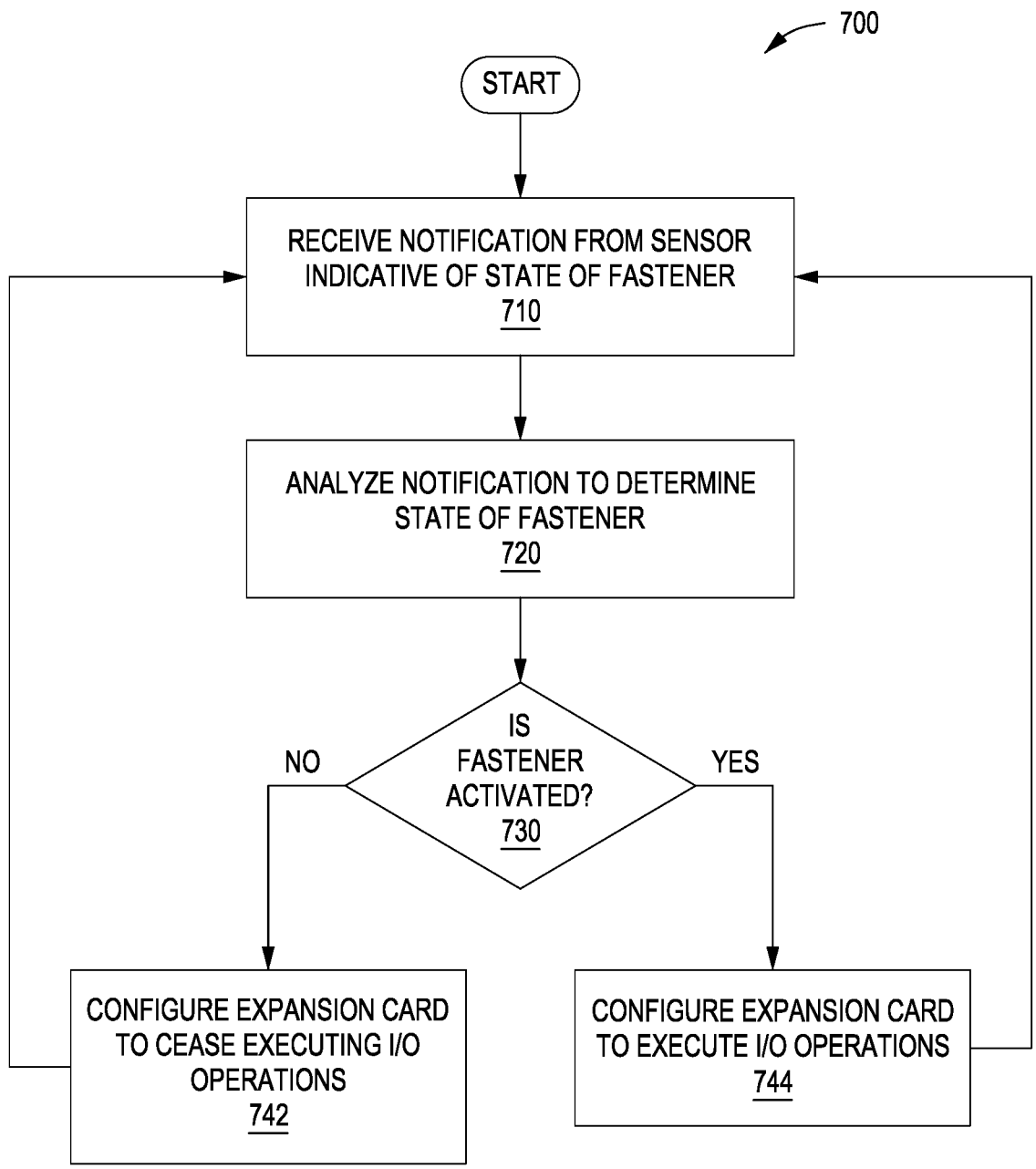
FIG. 7 illustrates a flow diagram of method steps for determining whether I/O operations can be performed with a hot swapped an expansion card, according to various embodiments.

FIG. 7 illustrates a flow diagram of method steps for determining whether I/O operations can be performed with a hot swapped expansion card 110, according to various embodiments. Although the method steps are described in conjunction with the system of FIGS. 1-4, persons skilled in the art will understand that any system configured to perform the method steps, in any order, falls within the scope of the present disclosure.

A method 700 begins at step 710, where driver 540 receives a notification from sensor 130. The notification indicates the state of primary fastener 320. Sensor 130 could include a pressure sensor that detects the pressure applied by primary fastener 320 on a surface proximate to motherboard 300. Based on the amount of pressure applied by primary fastener 320 on the surface, sensor 130 could determine that primary fastener 320 is activated or deactivated. Sensors 130 generate a notification that indicates the state of primary fastener 320 and transmits the notification to driver 540.

At step 720, driver 540 analyzes the notification to determine the state of primary fastener 720. At step 730, driver 540 determines whether primary fastener 320 is activated. If primary fastener 320 is activated, then driver 540 configures expansion card 110 to perform I/O operations with the CPU and/or various devices on motherboard 100. The method 700 returns to step 710, where driver 540 receives a second notification from sensors 710. If primary fastener 320 is not activated, then driver 540 configures expansion card 110 to cease performing I/O operations with the CPU and/or other devices on motherboard 100. The method 700 returns to step 710, where driver 540 receives a second notification from sensors 710.

In sum, before hot unplugging an expansion card, a fastener mechanism secures the expansion card to the motherboard. When the primary fastener in the fastener mechanism is deactivated, a sensor detects that the primary fastener is deactivated and sends a notification to the CPU. The notification indicates that that the CPU should cease performing 1/0 operations with the expansion card. In addition, deactivating a primary fastener included in the fastener mechanism opens a switch. Opening the switch shuts off the voltage supply to the expansion card and changes the state of an indicator from a second state to a first state. Furthermore, deactivating the primary fastener activates a secondary fastener included in the fastener mechanism, which secures the expansion card in place. When the indicator is in the first state, the secondary fastener can be deactivated and the expansion card can be removed from the slot.

Before hot plugging an expansion card, the switch is open and the indicator is in a first state. The expansion card is inserted into the expansion slot and the secondary fastener is activated on the expansion card. Next, the primary fastener is activated on the expansion card. Activating the primary fastener closes a switch. Closing the switch supplies a voltage to the expansion card and changes the state of an indicator from a first state to a second state. In addition, a sensor detects that the fastener mechanism is activated and sends a notification to the CPU. The notification indicates that the CPU can perform I/O operations with the expansion card.

At least one advantage of the techniques described herein is that an expansion card can be inserted and/or removed from an expansion slot in the motherboard without shutting off power to the motherboard. As a result, users can dynamically increase and decrease the processing power of a CPU by adding and removing expansion cards, without stopping the CPU from performing processing tasks. The techniques discloses herein further reduce the likelihood hardware damage when hot plugged and/or hot unplugged an expansion card. In addition, these techniques protect data integrity in storage devices.

1. In some embodiments, an apparatus for hot swapping an expansion card comprises a fastener mechanism for coupling an expansion card to a motherboard; and a switch for controlling voltage supply to the expansion card, wherein, when the fastener mechanism is in an activated state, the fastener mechanism secures the expansion card to the motherboard and the switch causes voltage to be supplied to the expansion card, and wherein, when the fastener mechanism is in a partially activated state, the fastener mechanism secures the expansion card to the motherboard and the switch prevents voltage from being supplied to the expansion card.

2. The apparatus of clause 1, wherein, when the fastener mechanism is in the deactivated state, the expansion card is unsecured and the switch prevents voltage from being supplied to the expansion card.

3. The apparatus of clauses 1 or 2, wherein the fastener mechanism includes a primary fastener and a secondary fastener that each independently secure the expansion card to the motherboard when in a sub-component activated state.

4. The apparatus of any of clauses 1-3, wherein, when the fastener mechanism is in the activated state, the primary fastener and the secondary fastener are in the sub-component activated state.

5. The apparatus of any of clauses 1-4, wherein the switch causes voltage to be supplied to the expansion card only when the primary fastener is in the sub-component activated state.

6. The apparatus of any of clauses 1-5, wherein, when the fastener mechanism is in the partially activated state, the primary fastener is in the sub-component deactivated state and the secondary fastener is in the sub-component activated state.

7. The apparatus of any of clauses 1-6, wherein the primary fastener comprises a screw and the secondary fastener comprises a spring, and wherein, when the primary fastener is in the sub-component activated state, a screw head of the screw covers an area of the expansion card.

8. The apparatus of any of clauses 1-7, further comprising an indicator mechanism coupled to the voltage supply, wherein, when voltage is supplied to the expansion card, the indicator mechanism generates a first indication, and, when voltage is not supplied to the expansion card, the indicator mechanism generates a second indication.

9. The apparatus of any of clauses 1-8, further comprising a sensor that detects when the fastener mechanism is in the activated state or the partially activated state.

10. The apparatus of any of clauses 1-9, wherein a first voltage source and a second voltage source supply voltage to the expansion card, and wherein the switch controls voltage supply only from the first voltage source.

11. In some embodiments, a system for hot swapping an expansion card comprises a motherboard; an expansion card; and a fastening mechanism for coupling the expansion card to the motherboard, wherein a first component of the fastening mechanism secures the expansion card to the motherboard for a temporary period after a second component of the fastening mechanism releases the expansion card.

12. The system of clause 11, further comprising a switch that controls a first voltage supply to the expansion card.

13. The system of clauses 11 or 12, wherein, when the second component releases the expansion card, the switch prevents the first voltage supply from supplying voltage to the expansion card.

14. The system of any of clauses 11-13, further comprising a capacitor that supplies a voltage to the expansion card for a limited time after the switch prevents the first voltage supply from supplying voltage to the expansion card.

15. The system of any of clauses 11-14, wherein the first component comprises a spring and the second component comprises a screw.

16. The system of any of clauses 11-15, further comprising an indicator mechanism coupled to the voltage supply, wherein, when voltage is supplied to the expansion card, the indicator mechanism generates a first indication, and, when voltage is not supplied to the expansion card, the indicator mechanism generates a second indication.

17. The system of any of clauses 11-16, further comprising a sensor that detects when the second component releases the expansion card.

18. The system of any of clauses 11-17, wherein the sensor transmits a notification to a processing unit coupled to the expansion card upon detecting that the second component has released the expansion card.

19. In some embodiments, a method for hot swapping an expansion card comprises receiving a notification that a fastener mechanism has been released, wherein the fastener mechanism secures an expansion card to a motherboard; causing one or more in-flight 1/0 operations associated with the expansion card to be completed; and preventing additional input/output operations from being transmitted to the expansion card.

20. The method of clause 19, wherein, during a temporary period after the fastener mechanism has been released, voltage is supplied to the expansion card from a secondary voltage source independent of a primary voltage source controlled by the fastening mechanism.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. An apparatus, comprising:
a fastener mechanism that couples an expansion card to a motherboard; and
a switch that controls voltage supply to the expansion card,
wherein, when the fastener mechanism is in a first state, the switch causes voltage to be supplied to the expansion card, and
wherein, when the fastener mechanism is in a second state, the switch prevents voltage from being supplied to the expansion card.

2. The apparatus of claim 1, wherein, a tensioning device within the fastener mechanism keeps the expansion card in place in between the first state and the second state.

3. The apparatus of claim 1, wherein the first state comprises an activated state, and the second state comprises a partially activated state.

4. The apparatus of claim 1, wherein, when the fastener mechanism is in either the first state or the second state, the fastener mechanism secures the expansion card to the motherboard.

5. The apparatus of claim 1, wherein, when the fastener mechanism is in a deactivated state, the expansion card is unsecured and the switch prevents voltage from being supplied to the expansion card.

6. The apparatus of claim 1, wherein the fastener mechanism includes a primary fastener and a secondary fastener that secure the expansion card to the motherboard when in a sub-component activated state.

7. The apparatus of claim 6, wherein, when the fastener mechanism is in the first state, the primary fastener and the secondary fastener are in the sub-component activated state.

8. The apparatus of claim 6, wherein the switch causes voltage to be supplied to the expansion card only when the primary fastener is in the sub-component activated state.

9. The apparatus of claim 6, wherein, when the fastener mechanism is in the second state, the primary fastener is in a sub-component deactivated state, and the secondary fastener is in the sub-component activated state.

10. The apparatus of claim 6, wherein the primary fastener comprises a screw, and the secondary fastener comprises a spring, and wherein, when the primary fastener is in the sub-component activated state, a screw head of the screw covers an area of the expansion card.

11. The apparatus of claim 1, further comprising:
an indicator mechanism coupled to the voltage supply,
wherein, when voltage is supplied to the expansion card, the indicator mechanism generates a first indication, and, when voltage is not supplied to the expansion card, the indicator mechanism generates a second indication.

12. The apparatus of claim 1, further comprising a sensor that detects when the fastener mechanism is in the first state or the second state.

13. The apparatus of claim 1, wherein a first voltage source and a second voltage source supply voltage to the expansion card, and wherein the switch controls voltage supply from the first voltage source.

14. A system, comprising:
a motherboard;
an expansion card; and
a fastener mechanism that couples the expansion card to the motherboard;
wherein, when the fastener mechanism is in a first state, the motherboard causes voltage to be supplied to the expansion card, and
wherein, when the fastener mechanism is in a second state, the motherboard prevents voltage from being supplied to the expansion card.

15. The system of claim 14, wherein, a tensioning device within the fastener mechanism keeps the expansion card in place in between the first state and the second state.

16. The system of claim 14, further comprising a capacitor that supplies a voltage to the expansion card for a limited time after the motherboard prevents the voltage from being supplied to the expansion card.

17. The system of claim 14, wherein a first component of the fastening mechanism secures the expansion card to the motherboard for a temporary period after a second component of the fastening mechanism releases the expansion card.

18. The system of claim 17, wherein the first component comprises a spring and the second component comprises a screw.

19. The system of claim 17, further comprising a sensor that detects when the second component releases the expansion card.

20. The system of claim 19, wherein the sensor transmits a notification to a processing unit coupled to the expansion card upon detecting that the second component has released the expansion card.

* * * * *